United States Patent
Arai et al.

[19]

[11] Patent Number: 6,037,823
[45] Date of Patent: Mar. 14, 2000

[54] OFFSET CORRECTION CIRCUIT

[75] Inventors: Masashi Arai; Masaaki Nara; Hiroki Seyama, all of Gunma-ken, Japan

[73] Assignee: Sanyo Electric Co., Ltd., Osaka, Japan

[21] Appl. No.: 09/046,221

[22] Filed: Mar. 23, 1998

[30] Foreign Application Priority Data

Mar. 28, 1997 [JP] Japan .................................... 9-078310
Sep. 16, 1998 [JP] Japan .................................. 10-261921

[51] Int. Cl.$^7$ ...................................................... H03L 5/00
[52] U.S. Cl. .......................................... 327/307; 327/362
[58] Field of Search ................................. 327/307, 362, 327/363

[56] References Cited

U.S. PATENT DOCUMENTS

| | | | |
|---|---|---|---|
| 4,363,977 | 12/1982 | Tsuda et al. ............................... | 327/73 |
| 4,377,759 | 3/1983 | Ohhata et al. .......................... | 327/307 |
| 4,975,657 | 12/1990 | Eastmond ................................. | 327/72 |
| 5,539,779 | 7/1996 | Nagahori ................................ | 327/307 |

*Primary Examiner*—Toan Tran
*Attorney, Agent, or Firm*—Cantor Colburn LLP

[57] ABSTRACT

A current to voltage conversion circuit is formed of a differential amplifier circuit (1) with a negative input terminal connected to a light receiving element (3) and a register (4) which feeds back an output signal to the negative input terminal of the differential amplifier circuit (1) thereof. The variable gain amplifier circuit (5) amplifies the output voltage of the current to voltage conversion circuit to detect the bottom value of the output signal thereof. The comparator circuit (7) compares the bottom value with the reference value Vr1 so that current flowing through the resistor (4) can be adjusted according to the difference between the bottom value and the reference value Vr1. The offset of the output signal from the variable gain amplifier circuit (5) supplied through the output terminal OUT is thereby adjusted. Since the peak value of the output signal of the variable gain amplifier circuit (5) is detected and the gain of the variable gain amplifier circuit (5) is controlled according to the difference between the peak value and the reference value Vr2, an output signal of a predetermined level can be obtained.

4 Claims, 4 Drawing Sheets

OFFSET CORRECTION CIRCUIT

BACKGROUND OF THE INVENTION

1. Field of the Invention

The present invention relates to an offset correction circuit suitable for a current to voltage conversion circuit that converts an output current from a light emitting element into a voltage.

2. Description of the Related Art

Optical combinations means are known that transmit and receive data via a medium such as light, e.g. infrared rays, for example, as generally exemplified by a remote control for a television set. In such communication means, the light emitting element in the optical transmitter circuit emits data "1" or "0" while the light receiving element in the optical receiver circuit receives the transmitted data according to the output signal of the light receiving element. Then the output signal of the light receiving element is converted into data. FIG. 3 is a diagram illustrating a conventional current to voltage conversion circuit arranged in an optical receiver circuit to convert an output current from a light receiving element into a voltage.

Referring to FIG. 3, the differential amplifier 1 has its positive input terminal connected to the reference voltage source 2 and its negative input terminal connected to the light receiving element 3. A resistor is connected between the output terminal and the negative input terminal. The output current of the differential amplifier 1 is fed back via the resistor 4 to maintain the differential amplifier 1 in equilibrium so that the entire output current of the light receiving element 3 flows through the resistor 4. When receiving light, the light receiving element 3 supplies the output current I1. When the output current I1 flows through the resistor 4, the output voltage Vout (=I1×R+Vref, where R is the resistance of the resistor 4) occurs at the output terminal OUT due to a voltage drop across the resistor 4. The output current I1 depends on the light intensity, thus resulting in variations in the output voltage Vout at the output terminal OUT. As a result, an output signal representing "1" or "0" is produced according to the receive data from the output terminal OUT.

The IrDA infrared radiation transmission standards stipulate that the intensity of an effective received light for light reception range from 16 $\mu$W to 20 mW in order to detect light with a micro power. Where a micro power light is received with the current to voltage conversion circuit of FIG. 3, the resistance of the resistor 4 is set to e.g. 10 M$\Omega$ to produce the output of several volts at the output terminal OUT. However, when the current in voltage conversion circuit shown in FIG. 3 produces an offset current Ioff from the negative input terminal of the differential amplifier 1, the resistor 4 with a large resistance of 10M$\omega$ causes an offset voltage Voff of 10 volt seven if the offset current is as small as 1 $\mu$A. Such a large offset voltage adversely affects the operation of the current to voltage circuit. Particularly, the problem is that the current to voltage conversion circuit which operates on a low voltage of 3 or 5 volts cannot provide a large offset voltage as well as an output signal definitely representing "1" or "0".

SUMMARY OF THE INVENTION

The present invention is made to solve the above-mentioned problems and includes an objective of providing an offset correction circuit that corrects an offset of an output voltage from a current to voltage conversion circuit.

According to the present invention, an offset correction circuit that corrects an offset of an output voltage from a current to voltage circuit that converts an input current into a voltage comprises a first level detection circuit for detecting a level of an output voltage in the absence of the input current based on the output voltage of the current to voltage conversion circuit, and a correction circuit for correcting the output voltage of the current to voltage conversion circuit according to the level of the output voltage detected by the first level detection circuit.

According to a first aspect of the present invention, the first level detection circuit detects a peak value or bottom value of an output voltage of the current to voltage conversion circuit, the peak value or bottom value corresponding to the absence of the input current.

According to another aspect of the present invention, the current to voltage conversion circuit comprises a differential amplifier having a positive input terminal and a negative input terminal, and a feedback resistor for feeding back the output voltage from the differential amplifier to the negative input terminal. In this aspect, the correction circuit corrects the output voltage of the current to voltage conversion circuit by adjusting a current flowing through the feedback resistor.

According to yet another aspect of the present invention, the correction circuit comprises a comparator circuit for comparing the level of an output voltage in the absence of the input current detected by the first level detection circuit with a first reference voltage predetermined, whereby a current flowing through the feedback resistor is adjusted according to the output of the comparator circuit.

According to still another aspect, the offset correction circuit further comprises a variable gain amplifier circuit arranged between the current to voltage conversion circuit and the first level detection circuit, for amplifying the output voltage of the current to voltage conversion circuit with a variable gain thereof and supplying the result to the first level detection circuit; a second level detection circuit for detecting a level of the output signal of the variable gain amplifier circuit in the presence of the input current based on the output signal of the variable gain amplifier circuit; and a gain control circuit for controlling the gain of the variable gain amplifier circuit according to the level detected by the second level detection circuit.

According to still another aspect, the second level detection circuit detects a peak value or bottom value of an output voltage from the current to voltage conversion circuit, the peak value or bottom value corresponding to the presence of the input current.

As described above, according to the present invention, the offset correction circuit detects the output voltage of the current to voltage conversion circuit in the absence of an input signal and then shifts the output voltage thereof based on the detected output voltage, thus compensating for the offset of the output voltage.

BRIEF DESCRIPTION OF THE DRAWINGS

This and other objects, features, and advantages of the present invention will become more apparent in the following detailed description and drawings, in which.

DESCRIPTION OF THE PREFERRED EMBODIMENTS

Next, preferred embodiments of the present invention will be described with reference to the attached drawings.

Figure 1:
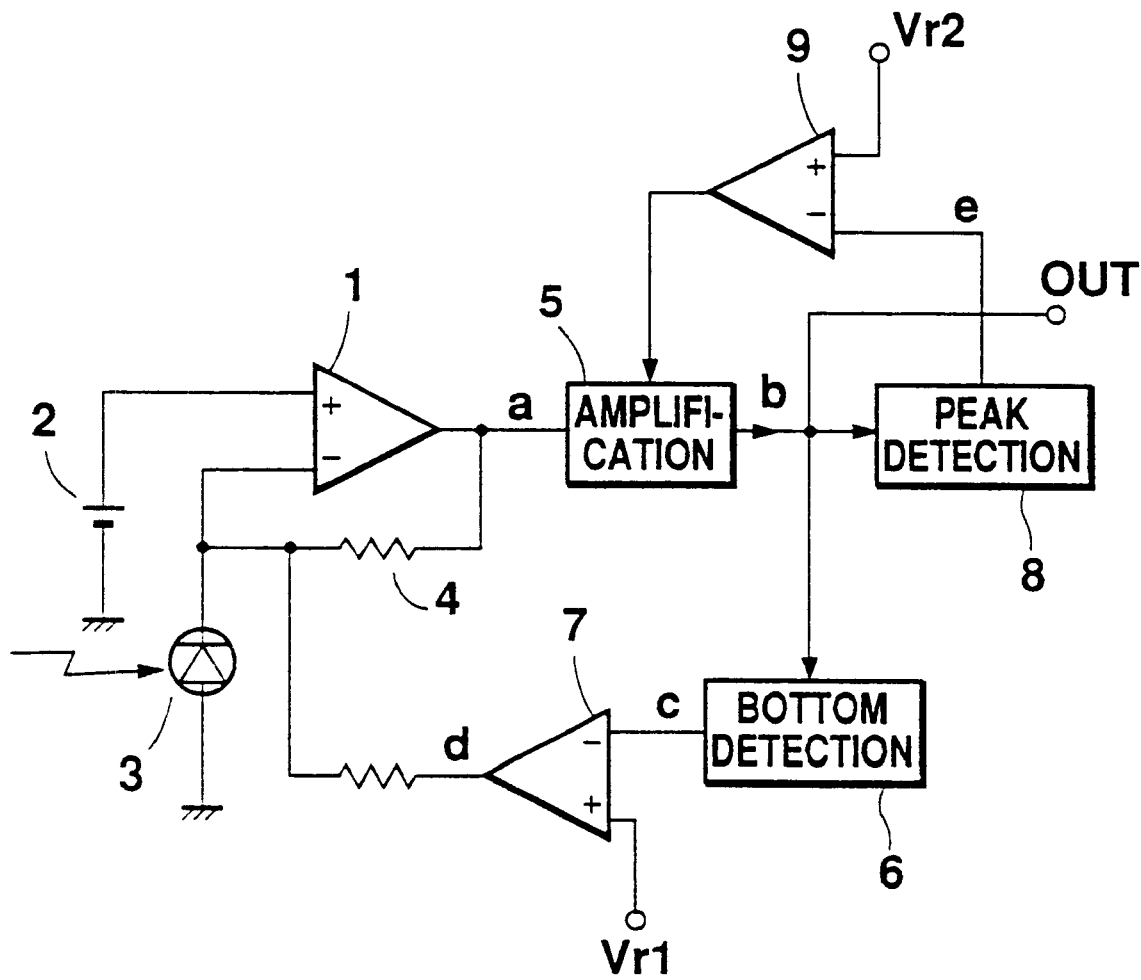
FIG. 1 is a block circuit diagram showing an offset correction circuit according to an embodiment of the present invention.
Figure 3:
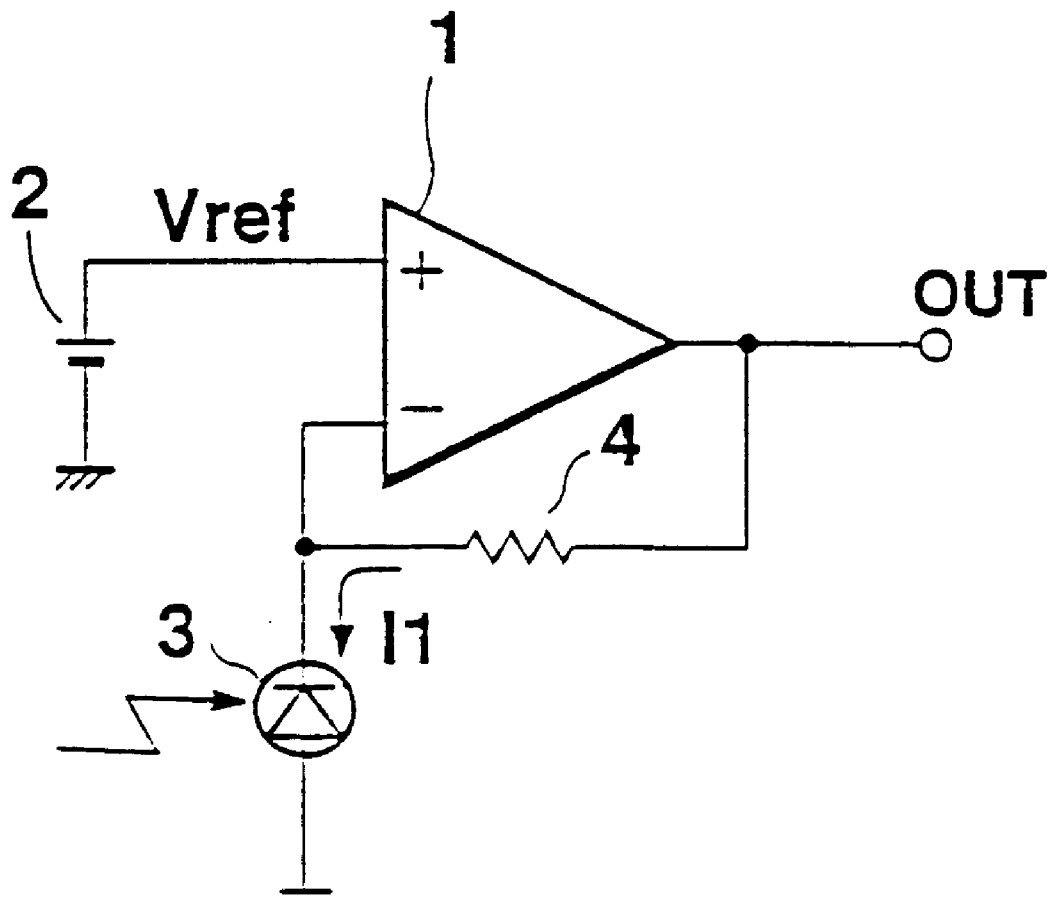
FIG. 3 is a block circuit diagram illustrating a conventional offset correction circuit.

FIG. 1 is a block circuit diagram illustrating an offset correction circuit according to an embodiment of the present invention. Referring to FIG. 1, the offset correction circuit consists of a variable gain amplifier circuit 5 that amplifies an output voltage from the output terminal of the differential amplifier 1, a bottom detection circuit 6 that detects the bottom of an output signal of the variable gain amplifier circuit 5, a comparator circuit 7 that compares the output signal from the bottom detection circuit 6 with the reference voltage Vr1 and then varies the current flowing through the resistor 4 according to the comparison result, a peak detection circuit 8 that detects the peak of an output signal from the variable gain amplifier circuit 5, and a comparator circuit 9 that compares the output signal from the peak detection circuit 8 with the reference voltage Vr2 and then varies the gain of the variable gain amplifier circuit 5 according to the comparison result. A correction circuit is formed of the bottom detection circuit 6 and the comparator circuit 7. In FIG. 1, the same numerals as those used in FIG. 3 represent corresponding elements, and their description will not be reported here.

Figure 2A:
FIGS. 2A, 2B, 2C, 2D, 2E, 2F, and 2G are diagrams illustrating waveforms at various points in the offset correction circuit shown in FIG. 1.
Figure 2B:
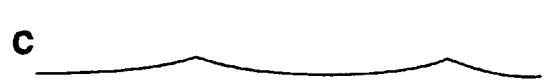

Referring to FIG. 1, when the light receiving element 3 receives light, the current passing through it is converted into a voltage by means of the resistor 4. When the light receiving element 3 receives no light, no current flows through the light receiving element 3 or the resistor 4. As a result, the differential amplifier 1 outputs an output voltage a representing "0" or "1" at its output terminal, as shown in FIG. 2A. The output voltage a is amplified by the variable gain amplifier circuit 5. The bottom detection circuit 6 the detects the bottom of the output voltage b of the variable gain amplifier circuit 5, thus detecting the level representing "0" of the output voltage b. Since the time constant of the bottom detection circuit 6 is set to a large value, the output signal c of the bottom detection circuit 6 varies small corresponding to the variation of the output voltage a, as shown in FIG. 2B. The comparator circuit 7 receives the output voltage c of the bottom detection circuit 6, and then produces the output current d corresponding to the difference between the output signal c and the reference value Vref. The output current d is added to the current flowing through the resistor 4. The resultant current is supplied to the light emitting element 3.

Figure 2C:
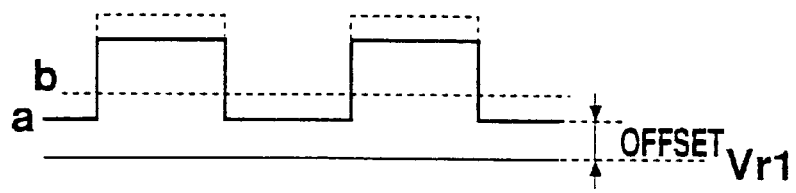

An offset, for example, is superposed on the output voltage a. When the output voltage a is high by the offset, as shown with solid lines in FIG. 2C, the variable gain amplifier circuit 5 amplifies the output signal b by its gain component, as shown with broken lines in FIG. 2C. The bottom detection circuit 6 detects the bottom value of the output signal b. The comparator circuit 7 compares the bottom value with the reference value Vr1 so that the degree of the offset is detected. The output current d flows corresponding to the offset. That is, when the comparator circuit 7 creates the output current d equal to the offset current flowing through the resistor 4, thus supplying the entire offset current flowing through the light receiving element 3, so that no offset current flows through the resistor 4. Thus, the offset voltage is not superposed on the output voltage a from the differential amplifier 1. This operation results in correcting the offset. Even if a variation in the output signal c of the bottom detection circuit 6 is small and the output voltage a is "1" or "0", the offset can be always and roughly eliminated because the time constant of the bottom detection circuit 6 is set to a large value.

The peak detection circuit 8 detects the peak of the output the output signal b representing "1" of the variable gain amplifier circuit 5. The comparator circuit 9 compares the output signal e of the peak detection circuit 8 with the reference value Vr2 and then supplies the output signal f corresponding to the difference between the output signal e, or the comparison result, and the reference value Vr2 to the variable gain amplifier circuit 5. The gain of the variable gain amplifier circuit 5 varies corresponding to the output signal f. At this time, since the gain is varied so as to equalize the output signal e of the peak detection circuit 8 to the reference value Vr2, the level "1" of the output signals b of the variable gain amplifier circuit 9 is set to a predetermined level.

Figure 2D:
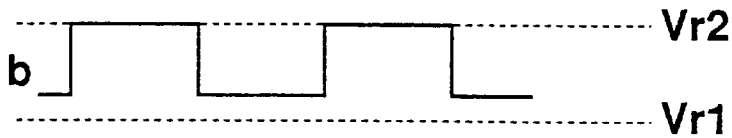
Figure 2E:
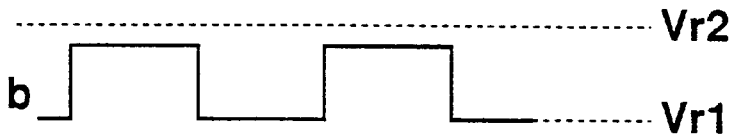
Figure 2F:
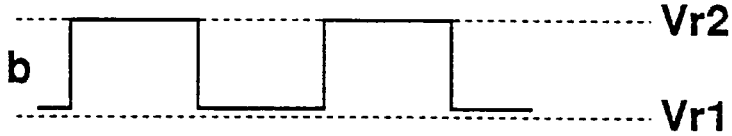
Figure 2G:
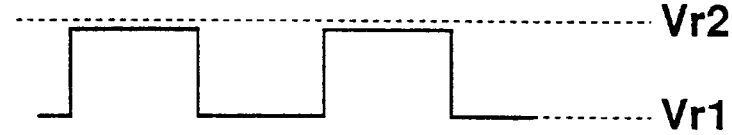

Next, the gain varying operation of the variable gain amplifier circuit 5 will be described below together with the offset adjusting operation. The variable gain amplifier circuit 5 amplifies the output voltage a to the levels "1" and "0", that is, the bottom value and the peak value of the output signal b. The peak value is equaled to the reference Vr2, as shown in FIG. 2D. Thereafter, the current flowing through the resistor 4 is adjusted according to the output signal from the comparator circuit 7 so that the output voltage a is shifted so as to equalize the bottom value to the reference value Vr1, as shown in FIG. 2E. When the output voltage a is shifted, the peak value of the output signal b shifts from the reference value Vr2, as shown in FIG. 2E. Thus, the gain of the variable gain amplifier circuit 5 again varies according to the difference between the peak value and the reference value Vr2, so that the peak value of the output signal b becomes equal to the reference value Vr2, as shown in FIG. 2F. Moreover, when the output voltage a is amplified, the bottom value of the output signal b is boosted, thus shifting from the reference value Vr1, as shown in FIG. 2F. In such an operation, the current flowing through the resistor 4 is adjusted according to the difference between the bottom value and the reference value Vr1, so that the bottom value of the output signal b is equalized to the reference value Vr1 as shown in FIG. 2G. By repeating the above-mentioned operation, the error between the bottom value and the reference value Vr1 and the error between the peak value and the reference value Vr2 are decreased, so that the levels "1" and "0" of the output signal b are set to predetermined values, respectively. Thus, the offset which occurs because of the internal characteristic of the current to voltage conversion circuit can be compensated while the voltage converted output signal with no offset can be produced from the output terminal OUT.

The offset correction circuit of FIG. 1 can compensate for an offset due to an external disturbance signal such as the sunlight received by the light receiving element 3, in addition to the internal offset which occurs in the current to voltage conversion circuit.

Figure 4:
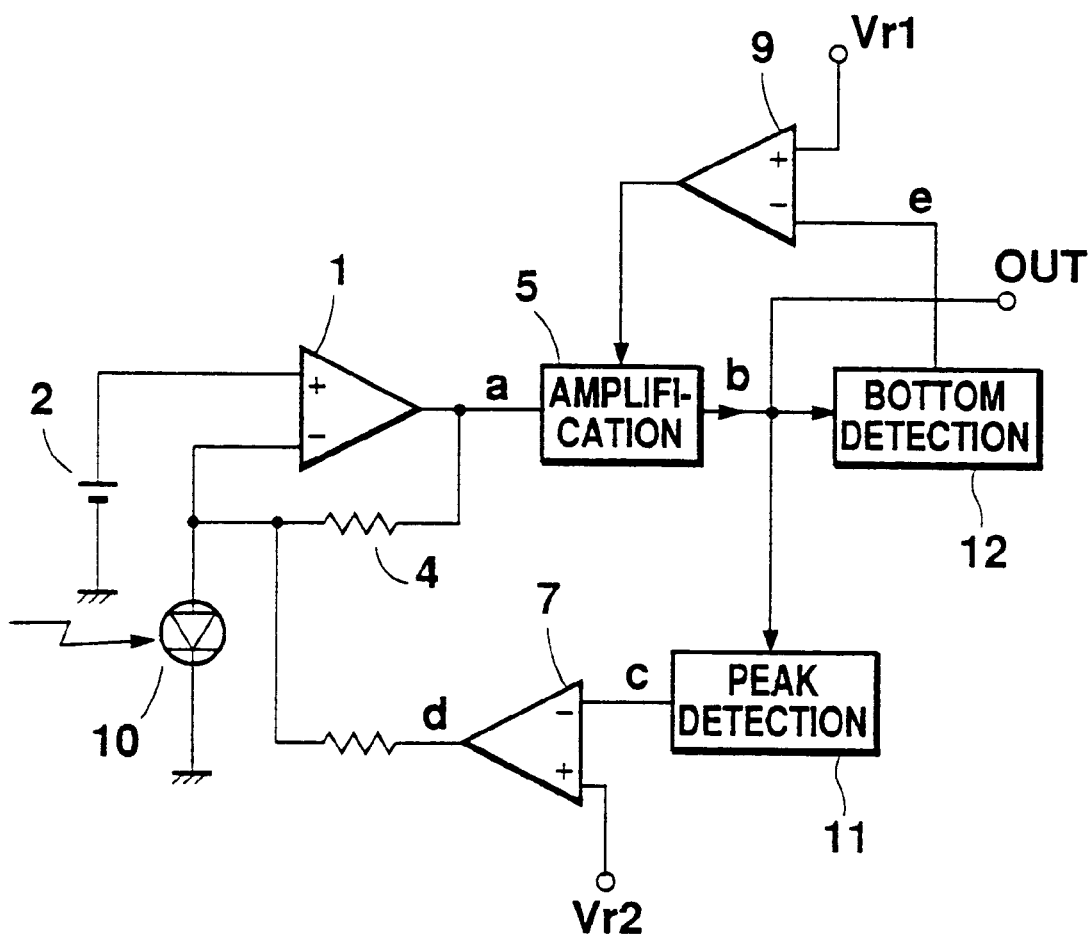
FIG. 4 is a block circuit diagram illustrating an offset correction diagram according to another embodiment of the present invention.

Furthermore, the offset correction circuit shown in FIG. 4 can be used according to the present invention. In this embodiment, the light receiving element 10 is used in place of the light receiving element 3. When the light receiving element 10 does not receive light, it outputs the power source voltage. When the light receiving element 10 does receive light, it outputs the earth potential. Hence, in no signal state, the light receiving element 10 outputs the power source voltage at its terminal connected to the resistor 4. In a similar manner to that just described, the peak detection circuit 11 detects the peak value of the output signal b to adjust the current flowing through the resistor 4, so that the offset can be corrected. Moreover, the bottom detection circuit 12 detects the bottom value of the output signal b to adjust the gain of the variable gain amplifier circuit 5 so that the output level of the current to voltage conversion circuit can be adjusted.

According to the present invention, an offset of the output voltage caused by a current to voltage conversion operation is directly detected and the offset output voltage can be compensated based on the detected offset level. Hence, even an output signal with a large offset can be compensated for accurately. Particularly, since a large offset level can be directly detected, accurate offset correction can be always established, even if the offset varies due to the resistance value of the resistor constituting the current to voltage conversion circuit. This feature allows the resistor to be set to a given value.

Furthermore, since the output voltage level obtained through current to voltage conversion is detected at a light irradiation time and then adjusted to a predetermined level, an output voltage with a predetermined level can be always obtained, even if the power of a received light is feeble or high.

What is claimed is:

1. An offset correction circuit that corrects an offset of an output voltage from a current to voltage circuit that converts an input current into a voltage, comprising:

a first level detection circuit for detecting a level of an output voltage in the absence of said input current based on said output voltage of said current to voltage conversion circuit, and a correction circuit for correcting the output voltage of said current to voltage conversion circuit according to the level of said output voltage detected by said first level detection circuit, wherein said current to voltage conversion circuit comprises a differential amplifier having a positive input terminal and a negative input terminal, and a feedback resistor for feeding back the output voltage from said differential amplifier to said negative input terminal, wherein said correction circuit corrects the output voltage of said current to voltage conversion circuit by adjusting a current flowing through said feedback resistor.

2. The offset correction circuit, defined in claim 1, wherein said correction circuit comprises a comparator circuit for comparing the level of an output voltage in the absence of the input current detected by said first level detection circuit with a first reference voltage predetermined, whereby a current flowing through said feedback resistor is adjusted according to the output of said comparator circuit.

3. An offset correction circuit that corrects an offset of an output voltage from a current to voltage circuit that converts an input current into a voltage, comprising:

a first level detection circuit for detection circuit for detecting a level of an output voltage in the absence of said input current based on said output voltage of said current to voltage conversion circuit;

a correction circuit for correcting the output voltage of said current to voltage conversion circuit according to the level of said output voltage detected by said first level detection circuit;

a variable gain amplifier circuit arranged between said current to voltage conversion circuit and said first level detection circuit for amplifying the output voltage of said current to voltage conversion circuit with a variable gain thereof and supplying the result to said first level detection circuit;

a second level detection circuit for detecting a level of the output signal of said variable gain amplifier circuit in the presence of said input current based on the output signal of said variable gain amplifier circuit;

a gain control circuit for controlling the gain of said variable gain amplifier circuit according to the level detected by said second level detection circuit and wherein said current to voltage conversion circuit comprises a differential amplifier having a positive input terminal and a negative input terminal, and a feedback resistor for feeding back the output voltage from said differential amplifier to said negative input terminal, wherein said correction circuit corrects the output voltage of said current to voltage conversion circuit by adjusting a current flowing through said feedback resistor.

4. The offset correction circuit defined in claim 3, wherein said correction circuit comprises a comparator circuit for comparing the level of an output voltage in the absence of the input current detected by said first level detection circuit with a first reference voltage predetermined, whereby a current flowing through said feedback resistor is adjusted according to the output of said comparator circuit.

* * * * *